(12) United States Patent
Manohar et al.

(10) Patent No.: US 8,191,019 B2
(45) Date of Patent: May 29, 2012

(54) NON-PREDICATED TO PREDICATED CONVERSION OF ASYNCHRONOUS REPRESENTATIONS

(75) Inventors: Rajit Manohar, Ithaca, NY (US); Ilya Ganusov, San Jose, CA (US); Virantha Ekanayake, San Jose, CA (US); Kamal Chaudhary, Saratoga, CA (US); Clinton W. Kelly, San Jose, CA (US)

(73) Assignee: Achronix Semiconductor Corporation, Santa Clara, CA (US)

( * ) Notice: Subject to any disclaimer, the term of this patent is extended or adjusted under 35 U.S.C. 154(b) by 356 days.

(21) Appl. No.: 12/505,296

(22) Filed: Jul. 17, 2009

(65) Prior Publication Data

US 2011/0012666 A1    Jan. 20, 2011

(51) Int. Cl.
*G06F 17/50* (2006.01)
*H03K 17/00* (2006.01)
(52) U.S. Cl. ......................... 716/104; 716/103; 327/365
(58) Field of Classification Search .................. 716/103, 716/104, 126, 130; 703/15; 327/365
See application file for complete search history.

(56) References Cited

U.S. PATENT DOCUMENTS

| | | | |
|---|---|---|---|
| 2006/0041872 A1 | 2/2006 | Poznanovic et al. | |
| 2007/0198238 A1* | 8/2007 | Hidvegi et al. | 703/15 |
| 2007/0256038 A1 | 11/2007 | Manohar | |
| 2008/0301603 A1* | 12/2008 | Ja et al. | 716/5 |

FOREIGN PATENT DOCUMENTS

| | | |
|---|---|---|
| TW | 201133261 A | 10/2011 |
| WO | WO-2011009078 A1 | 1/2011 |

OTHER PUBLICATIONS

"International Application Serial No. PCT/US10/42329, Search Report mailed Sep. 7, 2010", 2 pgs.
"International Application Serial No. PCT/US10/42329, Written Opinion mailed Sep. 7, 2010", 8 pgs.
"International Application Serial No. PCT/US2010/042329, International Preliminary Report on Patentability mailed Oct. 14, 2011", 5 pgs.

* cited by examiner

*Primary Examiner* — Vuthe Siek
(74) *Attorney, Agent, or Firm* — Schwegman, Lundberg & Woessner, P.A.

(57) ABSTRACT

Methods, circuits and systems for converting of a non-predicated asynchronous netlist to a predicated asynchronous netlist are described. These may operate to identify one or more portions of an asynchronous netlist corresponding to a partially utilized portion of an asynchronous circuit. The asynchronous netlist may be modified to control the partially utilized portion. Additional methods, circuits, and systems are disclosed.

29 Claims, 9 Drawing Sheets

NON-PREDICATED TO PREDICATED CONVERSION OF ASYNCHRONOUS REPRESENTATIONS

BACKGROUND

Traditional synchronous circuit designs may be represented using a variety of hardware description languages, higher level description languages, netlists, and schematics. All of these synchronous circuit representations may define functionality in the presence of a clock signal or with a master timing signal used to synchronize operations. Synchronous operations have several advantages, including deterministic behavior, simplified design and testing, and portability. However, there are also occasions when it is desirable to make use of asynchronous operations

BRIEF DESCRIPTION OF THE DRAWINGS

Some embodiments of the disclosed technology are illustrated by way of example and not limitation in the figures of the accompanying drawings in which.

DETAILED DESCRIPTION

Example methods and systems for converting a non-predicated asynchronous netlist to a predicated asynchronous netlist will now be described. In the following description, numerous examples having example-specific details are set forth to provide an understanding of example embodiments. It will be evident, however, to one of ordinary skill in the art, after reading this disclosure, that the present examples may be practiced without these example-specific details, and/or with different combinations of the details than are given here. Thus, specific embodiments are given for the purpose of simplified explanation, and not limitation.

Some example embodiments described herein may comprise a method including identifying one or more portions of an asynchronous netlist corresponding to a partially utilized portion of an asynchronous circuit. The asynchronous netlist may be modified to control the partially utilized portion. The partially utilized portion may be a portion of the asynchronous circuit that generates results that can be discarded during the operation of the asynchronous circuit. The modification may involve a logic circuit that controls the partially utilized portion.

Asynchronous circuit designs are represented using a variety of hardware description languages, higher level description languages, netlists, and schematics. Any representation of asynchronous computation is eventually decomposed into elementary operations that can be efficiently mapped onto hardware resources. Such decompositions may lead to discarding some computation results during operation of the circuit. Even though the results of these computations may sometimes be discarded, the corresponding circuits that implement these computations inevitably consume power, which may result in increasing power consumption of the circuit.

To avoid computations that produce unused results, the asynchronous representation will be translated into a predicated asynchronous representation, a discussed in more detail below, where additional logic circuits may dynamically turn off one or more portions of the design that can produce unused results. Predicated asynchronous circuit designs that can be formed in this way, and in other ways, will now be described.

Figure 1:
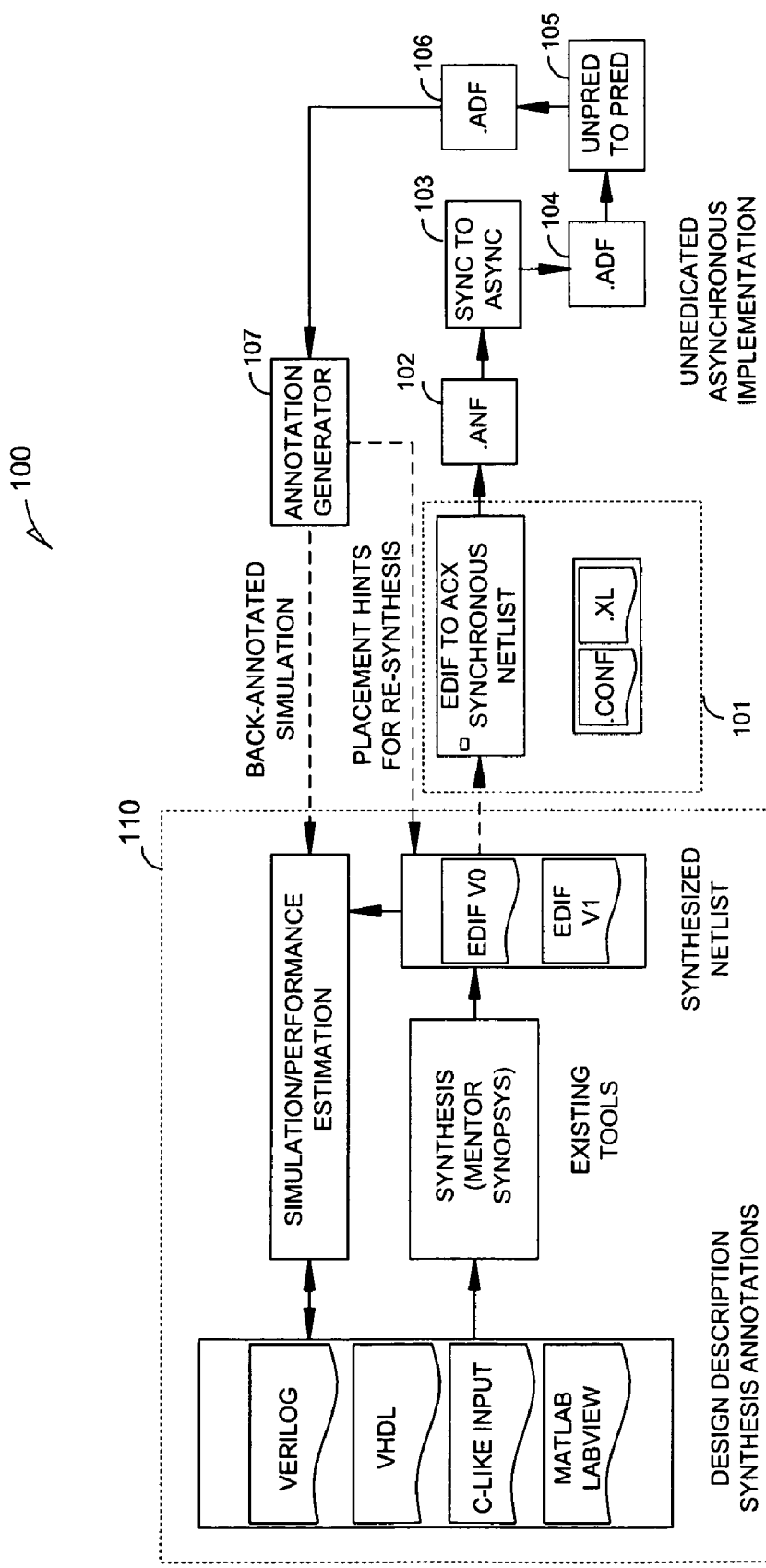
FIG. 1 is a block diagram illustrating a system for converting of a non-predicated asynchronous netlist to a predicated asynchronous netlist, according to various embodiments of the invention.

FIG. 1 is a block diagram illustrating a system 100 for converting of a non-predicated asynchronous netlist to a predicated asynchronous netlist, according to various embodiments of the invention. The system 100 shown in FIG. 1 comprises a tool flow, which may include tools and/or executable modules that can be executed by one or more processors such as a processor 910 of FIG. 9 or a processor 1160 of FIG. 11. Inputs for the tool flow may be described in an existing hardware description language (HDL) such as Verilog, very high-speed integrated circuits (VHSIC) HDL (VHDL), or any other language that is supported by synchronous synthesis tools.

Existing tools 110 can be used to simulate the operation of a high-level circuit description, as well as to synthesize the high-level description into an asynchronous netlist in a variety of formats, such as electronic design interchange format (EDIF) including EDIF 2 0 0. An EDIF reader tool 101 has been implemented that takes the EDIF, as well as a table, as input. The table may specify "black-box" modules in the EDIF (e.g., the fact that the EDIF cell name "AND2" comprises a two-input AND gate, etc.) and some details about the EDIF format that may vary from one synthesis tool to the other.

Converting from EDIF into a netlist format may be performed using known methods. The final output of the EDIF reader tool 101 comprises the synchronous netlist 102 (denoted by extension .ANF in FIG. 1). The synchronous netlist 102 may then be converted to an asynchronous netlist 104 using the synchronous to asynchronous conversion tool 103. The asynchronous netlist 104 may be equivalent to the synchronous netlist 102 in terms of computations that can be performed. The asynchronous netlist 104 may then be converted to a predicated asynchronous netlist 106 using the conversion tool 105 as will be described in more detail below.

The predicated asynchronous netlist 106 may be equivalent to the asynchronous netlist 104 in terms of computation results. However, the predicated asynchronous netlist 106 may contain additional logic circuitry (see for example, MUX 420 in FIG. 4 or logic circuit 840 in FIG. 8) to turn off activity of some portions of the asynchronous netlist 104 that may not contribute to computations that are utilized by other circuits in the asynchronous netlist 104. Methods of converting the un-predicated asynchronous netlists into corresponding predicated implementations will be discussed below. The predicated asynchronous netlist 106 may be fed into an annotation generator 107, which can generate annotations that translate the performance characteristics of the asynchronous implementations back into the synchronous domain for simulation by the existing tools 110.

The asynchronous netlist 104 may represent circuits that can be implemented efficiently as fine-grained asynchronous pipelines. The asynchronous netlist 104 may be represented as an asynchronous dataflow graph. Nodes in the asynchronous dataflow graph may operate on data values, referred to as tokens. A token may comprise a data item that can flow through an asynchronous pipeline. A token may comprise a one-bit value or a multi-bit value.

Operators in the dataflow graph receive input tokens on their inputs and produce output tokens on their outputs. The change in path may be specified by arrows that correspond to communication channels along which tokens can be sent and received. The communication channels may have no buffering, and sending and receiving a token on one or more channels may correspond to rendezvous synchronization between a sender and a receiver. The basic building blocks of an asynchronous dataflow graph are shown and discussed below with respect to FIG. 2.

Figure 2:
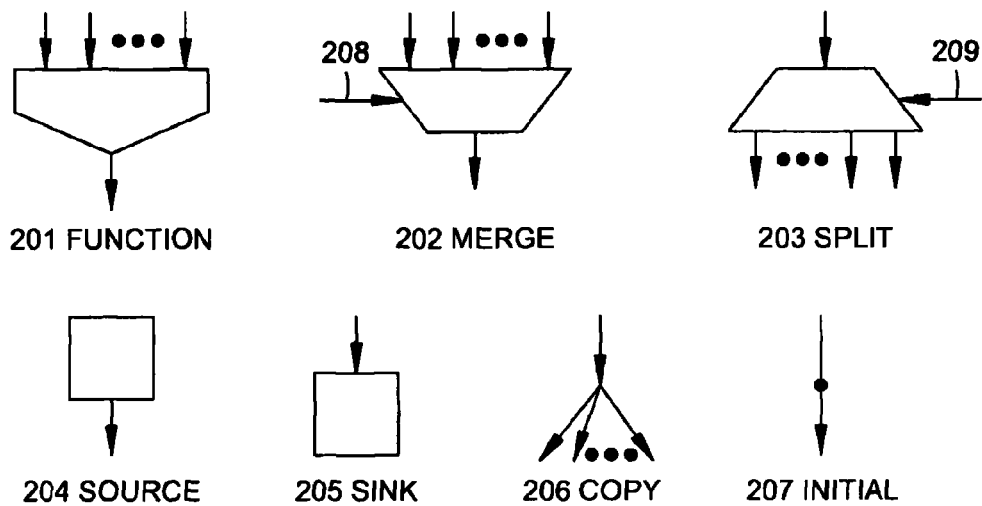
FIG. 2 is a diagram illustrating some asynchronous dataflow blocks for converting a non-predicated asynchronous netlist to a predicated asynchronous netlist, according to various embodiments of the invention.

FIG. 2 is a diagram illustrating asynchronous dataflow blocks for converting a non-predicated asynchronous netlist 104 to a predicated asynchronous netlist 106 (see FIG. 1), according to various embodiments of the invention. The dataflow blocks in FIG. 2 may also be referred to as "functional blocks". Alternatively, the word "functional" may be replaced with a corresponding functionality word such as "source", "sink", "copy" and the like. For example, those of ordinary skill in the art will realize that the replacement term "sink block" can be used in place of the term the "sink functional block", and that "source block" is a specific kind of block taken from the general category of "functional" blocks.

A computational unit comprises a function block 201, which has an arbitrary number of inputs and one output. The function block 201 may receive tokens from at least some of its inputs, compute a specified function, and produce the result of the function as an output token on its output. There can be many different types of function blocks that vary in the number of inputs they have, and in the operations they perform.

A source block 204 comprises an operator that may generate a stream of unlimited number of tokens on its output. The tokens generated by the source block 204 may have the same value. A sink block 205 comprises an operator that consumes an input token. A copy block 206 may replicate the token received on its input to all its outputs. An initial block 207 may begin by transmitting a token on its output, and thereafter copying an input token to its output. The blocks 201, 204, 205, 206, and 207 repeatedly receive one token on their respective inputs (if any), and send one token on each of their outputs (if any).

The merge block 202 has two types of inputs: data inputs (similar to other blocks), and a control input 208. The value of the control input 208 may specify the data input from which a token is received. The received token may then be sent to the output of the merge block 202. A split block 203 has a dual function. It receives a control value on its control input 209, and a data value on its data input. It sends the data value on the output channel specified by the value of the control input.

Figure 3:
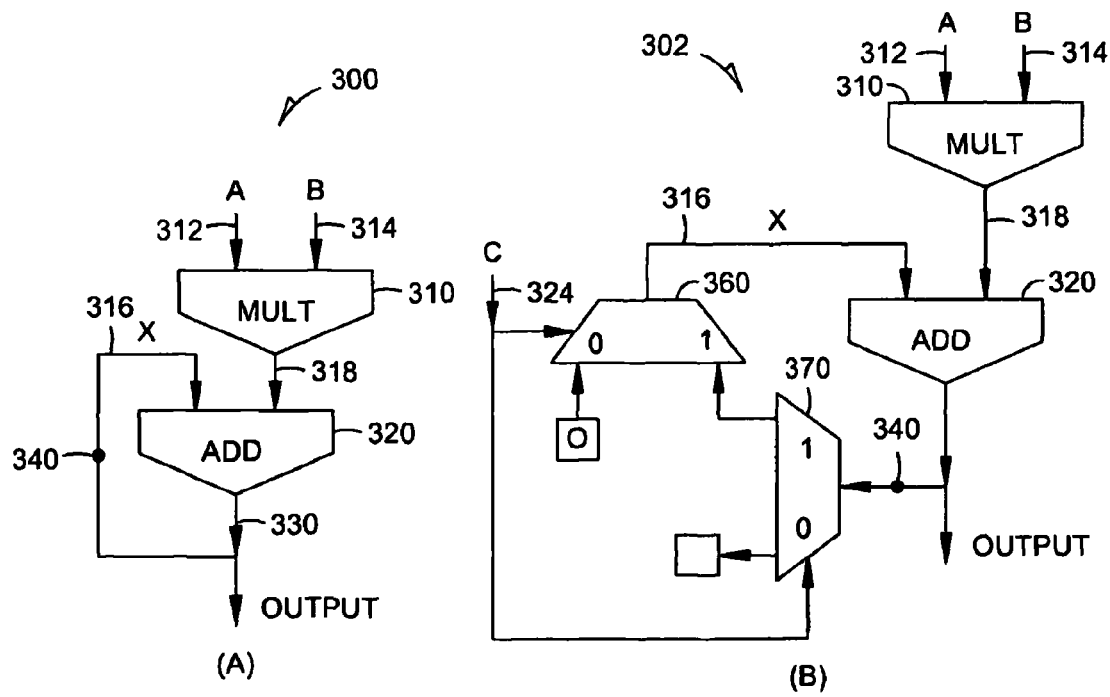
FIG. 3 is a diagram illustrating asynchronous dataflow computation graphs formed by the asynchronous dataflow blocks of FIG. 2, according to various embodiments of the invention.

FIG. 3 is a diagram illustrating asynchronous dataflow computation blocks formed by the asynchronous dataflow blocks of FIG. 2, according to various embodiments of the invention. FIG. 3 shows an example dataflow computation graph 300 that corresponds to an arithmetic operation that receives values for a variable X and two input tokens A and B and replaces X with an updated value X+A*B. Input tokens A and B may be received at inputs 312 and 314 of a multiplication function block (MULT) 310, and a token A*B is generated at the output 318. The token A*B may then be added to the current value of X using an addition function block (ADD) 320. This updated value is produced on the output 330 of the ADD 320 and is fed back into the input 316 of the ADD 320 through an initial block 340.

A modified version of this operation that takes an additional token C at an input 324 is shown in a dataflow computation graph 302. In dataflow computation graph 302, when the value of the token C is zero, a current value of X may be replaced with a value of 0, because the merge block 360 passes a 0 to the input 316 of the ADD 320. Otherwise, when the value of the token C is 1, a merge block 370 and the merge block 360 pass the output of the initial block 340 to the input 316 of the ADD 320 and the dataflow computation graph 302 behaves like the dataflow computation graph 300.

The proposed conversion method from an original un-predicated asynchronous netlist, (e.g., the asynchronous netlist 104 of FIG. 1) to a predicated asynchronous netlist (e.g., the predicated asynchronous netlist 106 of FIG. 1) may comprise two phases. In the first phase, the original netlist may be analyzed (e.g., by the processor 910 of FIG. 9), and one or more portions of the netlist associated with computations, of which the results may sometimes be discarded (e.g., may be partially utilized), are identified. This analysis may also operate to determine specific conditions under which such unused computations may be performed. The processor may implement this first phase as discussed below with respect to FIG. 4

The second phase may use the results of the analysis performed in the first phase to modify the asynchronous netlist by incorporating, in the original asynchronous netlist, an additional netlist portion. The additional netlist portion may correspond to a logic circuit (e.g., a logic circuit 840 of FIG. 8), which controls portions of the partially utilized portion by, for example, conditional execution.

Figure 4:
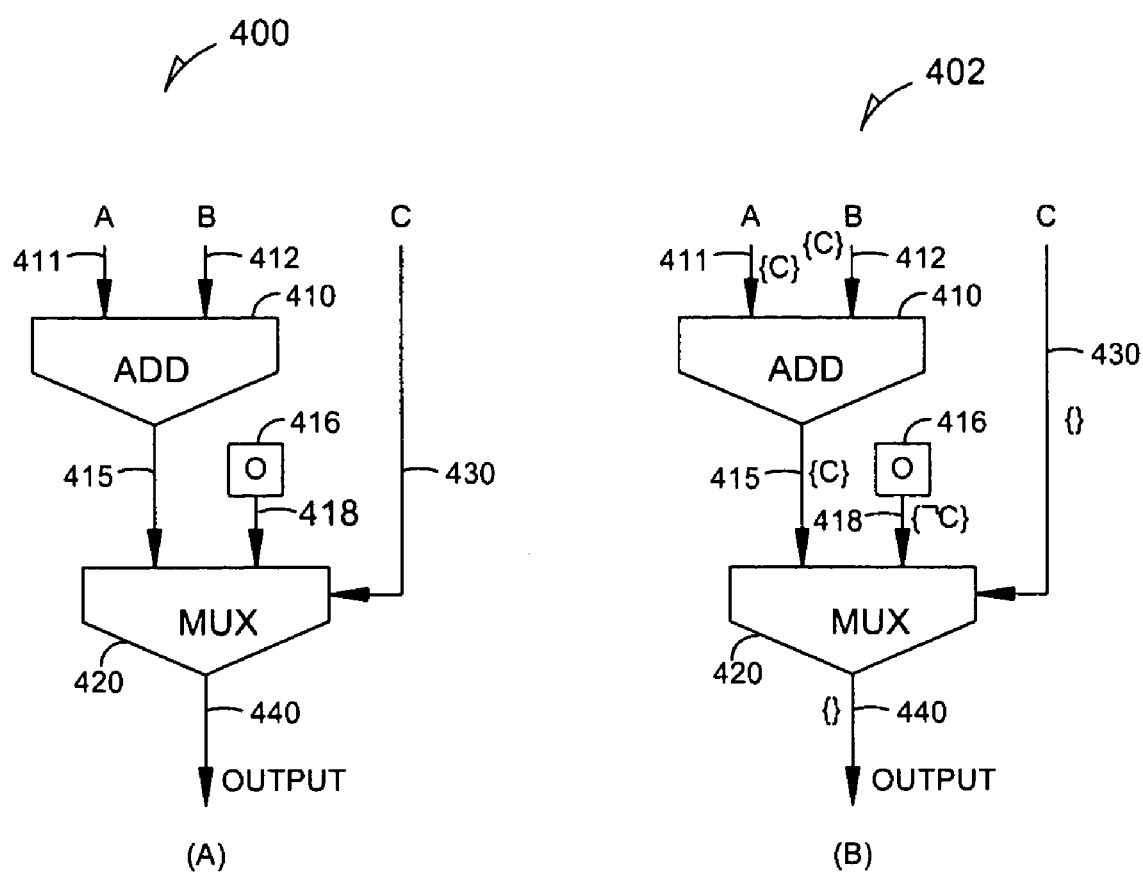
FIG. 4 is a diagram illustrating predicating an asynchronous dataflow computation block of FIG. 3, according to various embodiments of the invention.

FIG. 4 is a diagram illustrating predicating an asynchronous dataflow computation block of FIG. 3, according to various embodiments of the invention. A predicate analysis module (e.g., the predicate analysis module 950 of FIG. 9) may inspect edges and nodes of the asynchronous dataflow computation graph to identify one or more functional blocks or edges of the dataflow graph that may correspond to a partially utilized portion of the asynchronous circuit represented by the dataflow graph (e.g., dataflow computation blocks shown in FIG. 3). The predicate analysis module 950 may mark the identified one or more functional blocks or edges with predicate marks (e.g., labels) that indicate a controlling signal.

FIG. 4 shows an example dataflow computation graph 400 that sometimes produces unused computation results. Input tokens A and B received at inputs (also sometimes called input edges by those of ordinary skill in the art) 411 and 412 of an ADD 410 are added using the ADD 410. A multiplexer block (MUX) 420 may receive at its inputs a result token from an output 415 of the ADD 410 and a constant value 0 generated by a constant source 416. The MUX 420 propagates the result token or the constant value 0, based on the value of a control token C at its condition input 430. When the control token C is zero, the output 440 of the MUX 420 may be equal to the result token at output 415. Otherwise, when C is 1, the output 440 of the MUX 420 may be equal to 0. Based on the above analysis, when C is 1, the ADD 410 may produce an unused result.

The predicate analysis module 950 may operate to mark edges that can carry ignored values with labels that show when edge values may be ignored. These labels may be referred to as "predicates." The edges that have associated predicates may be referred to as "predicated edges," and blocks (also sometimes called nodes by those of ordinary skill in the art) that conditionally ignore input values may be said to "generate predicates".

A dataflow graph 402 shows an example of predicates used to predicate the dataflow computation graph 400. As described above, the output (also called output edge) 415 of ADD 410 may produce unused result when control token C is 1. Thus, the input edges 411 and 412 and the output edge 415 are marked with {C}, whereas the output 418 of the constant source 416 may be labeled with {-C} to show that constant source 416 sends unused data when C is 0.

The MUX 420 may generate predicate {C} for output edge 415 of the ADD 410 and predicate {-C} for the output edge 418 of the constant source 416. Since the value of the output edge 415 of the ADD 410 is unused when C is 1, input values for the ADD 410 can also be ignored. Therefore, input edges 411 and 412 may also be marked with predicate C (e.g., {C}). The absence of a predicate for a given edge may be taken to be equivalent to a predicate which always evaluates to 0. In an example embodiment, the predicate sense may be changed to indicate when an edge value is used, rather than not used. In other words the {C} and {-C} marks in the dataflow graph 402 may be replaced with {-C} and {C}, respectively, to mean that, for example, the value of the output edge 415 is unused when C is 0.

The predicate analysis module 950 may find some or all function nodes that operate to ignore at least some values of their input edges and label such edges with corresponding predicates as described above. In some embodiments, the predicate analysis module 950 may inspect predicates on the output edges of computation nodes (e.g., output edge 415 of ADD 410) and propagate them to one or more inputs of the computation nodes (e.g., input edges 411 and 412). When a node has multiple output edges with different predicates, they can be merged by applying the following rule: tokens on input edges may be ignored only when tokens on all output edges are ignored. For example, if the ADD 410 had an extra output edge with predicate D, then inputs edges 411 and 412 would be ignored only when both C and D were equal to 1. In other words, input edges 411 and 412 would be labeled with predicate {C & D}.

In some embodiments, the predicate analysis module 950 can process dataflow graph nodes and edges in any order, as long as the resulting predicates satisfy the propagation and generation rules outlined above. When a dataflow graph has cycles, the same nodes may be processed multiple times until edge predicates converge to a stable value. Different ways of processing graph nodes to achieve a convergence point are well-known to those of ordinary skill in the art and will not be discussed here. The second phase of converting of an asynchronous dataflow graph to a predicated asynchronous dataflow graph involves modifying the predicated asynchronous dataflow graph to prevent computation of ignored results, as discussed below.

Figure 5:
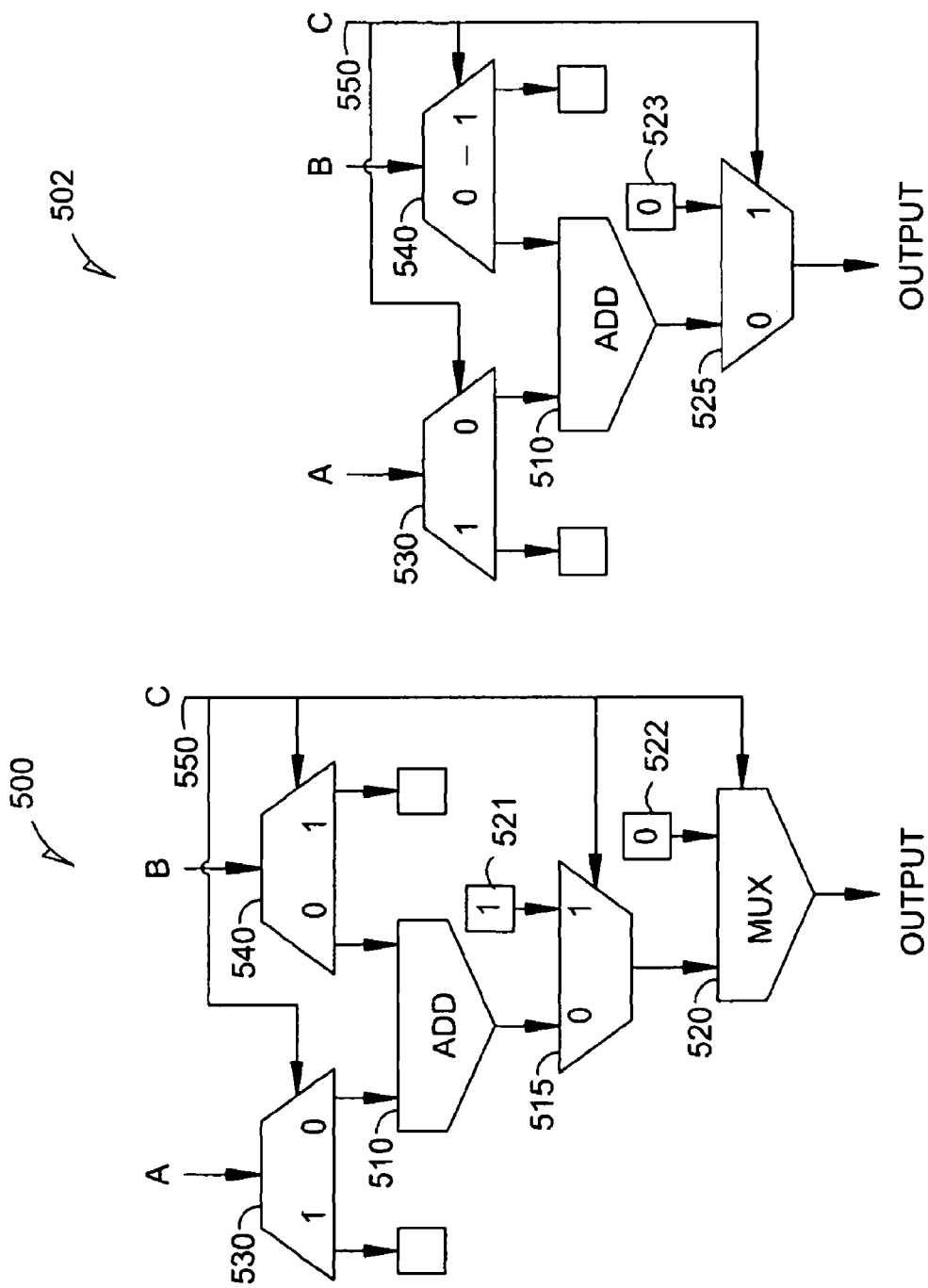
FIG. 5 is a diagram illustrating predicating an asynchronous dataflow computation block that implements conditional execution, according to various embodiments of the invention.

FIG. 5 is a diagram illustrating predicating an asynchronous dataflow computation block 500 that implements conditional execution, according to various embodiments of the invention. Modification of the asynchronous dataflow computation block 500 may be performed in two stages. The first stage may involve generating additional predication logic corresponding to a logic circuit (e.g., the logic circuit 840 of FIG. 8). In the second stage, the additional predication logic may be connected to the original asynchronous netlist (e.g., an asynchronous dataflow computation block 500). The additional predication logic may comprise function blocks that compute predicate expressions and merge/split blocks that prevent the flow of tokens into predicated regions of the asynchronous netlist.

The asynchronous dataflow computation block 500 shows a modified version of the dataflow computation graph 400 of FIG. 4. Propagation of the input tokens A and B may now be controlled by split blocks 530 and 540. When the split control input C is 0, data tokens A and B are propagated to the inputs of an ADD 510. When C is 1, input tokens are consumed by the split blocks 530 and 540, but not propagated, effectively preventing the ADD 510 from receiving any inputs. Since MUX 520 consumes all input tokens, netlist modification may involve insertion of merge and source blocks such as merge block 515 and source blocks 521 and 522 to provide MUX 520 with an input token whenever input tokens A and B are dynamically turned off.

FIG. 5 also includes an asynchronous dataflow computation block 502, which shows an alternative example implementation of conditional execution of the asynchronous dataflow computation block 500. This implementation replaces MUX 520 with a merge block 525, which chooses between consuming tokens from the ADD 510 and source block 523. Both implementations as shown in the asynchronous dataflow computation blocks 500 and 502 have equivalent functionality and either one can be chosen; however, the asynchronous dataflow computation block 502 may sometimes be implemented with fewer logic blocks as compared to the asynchronous dataflow computation block 500.

In some embodiments, modifying an asynchronous netlist, such as one associated with the asynchronous dataflow computation blocks shown in FIG. 5, may involve generating an additional netlist portion corresponding to the logic circuit that corresponds to a split block. In general, split blocks may be inserted on an output edge of a block if the block has no input edges with the same predicate. In other words, a split block may be inserted at an output edge of a predicated functional block that lacks an input edge that has a first predicate mark similar to a second predicate mark associated with the output edge. For example, the assumption in FIG. 5 is that blocks producing tokens A and B (not shown in FIG. 5) have input predicates which may be not equal to {C}.

Modifying an asynchronous netlist, such as one associated with the asynchronous dataflow computation blocks shown in FIG. 5, in some embodiments, may comprise generating an additional netlist portion corresponding to the logic circuit that corresponds to a merge block. Merge blocks may be inserted for predicated input edges of blocks which have no output edges with the same predicate. In other words, merge blocks may be inserted at one or more input edges of a predicated functional block that lacks an output edge that has a first predicate mark similar to a second predicate mark associated with the one or more input edges. For example, in FIG. 5, the output edge of MUX 520 has no predicate; therefore, the coupling of the predicated edge from ADD 510 to MUX 520 involves the merge block 515. On the other hand, the input control edge C has no predicate, and therefore it does not have a split block. Sources and sinks represent special cases, and therefore, their output/input edges are usually not modified.

Inserted splits and merges that dynamically turn off unused operations may consume extra hardware resources and may negatively impact power consumption and performance. For example, after the un-predicated dataflow graph 400 (FIG. 4) was converted into the predicated dataflow graph 402, the fan-out for the control input token C increased from one to three. This result may require extra routing resources that negatively impact the speed of the design and increase power consumption because of extra activity on the routing channels.

Below, we will discuss techniques that can operate to reduce these overhead results, specifically when some splits and merges separate predicated regions from unpredicted portions of the netlist, and others separate predicated regions with different predicates. The inter-region merges/splits may sometimes be removed, as shown in example embodiments below, by merging predicated regions into one region with a merged predicate.

Figure 6:
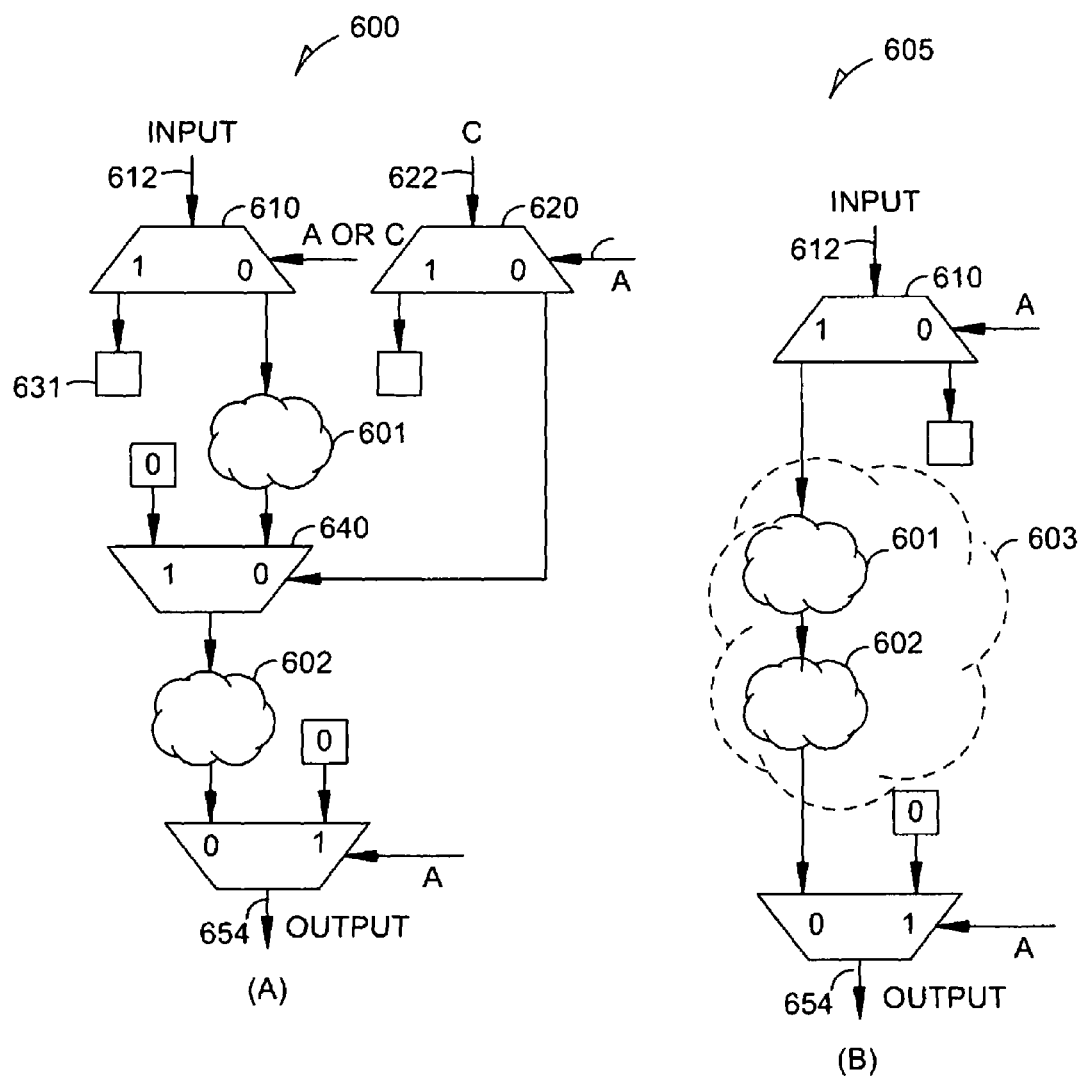
FIG. 6 is a diagram illustrating merging a predicated multi-region asynchronous dataflow computation block, according to various embodiments of the invention.

FIG. 6 is a diagram illustrating merging a predicated multi-region asynchronous dataflow computation block, according to various embodiments of the invention. Shown in FIG. 6 are examples of dataflow graphs 600 and 605 that implement conditional execution for two predicated regions 601 and 602. Here it is assumed that all input and output tokens are non-predicated (e.g., inputs 612, 622 and output 654), the region 601 is predicated by a predicate {A OR C} and the region 602 may be predicated by predicate {A}. Under this assumption, the regions 601 and 602 may be merged into one merged region 603 with the predicate {A}. Also, a split 620 and a merge block 640 that control conditional execution between the regions 601 and 602 may be removed, as shown in dataflow graph 605.

A person of ordinary skill in the art will realize, after reading this disclosure, that the merged region 603 may have a lower probability of being turned off than individual regions 601 and 602. For example, when predicates {A} and {C} have individual toggle rates of 50%, the original predicate {A OR C} has a 75% probability of being true (i.e., resulting in consuming the input 612 by a sink block 631 and effectively turning off region 601). After regions 601 and 602 are merged into the merged region 603, the merged region 603 will have probability of being turned off of 50%. Therefore, this technique can result in saving less power than when using separate predicated regions.

Information about operational probabilities for each token in a realistic environment may be collected and used to guide conditional execution adjustments like the one performed in dataflow graph 605. Such information may be referred to as profile feedback. In the case of region merging, we can use profile feedback to get probabilities for the operation of predicates {A} and {A OR C}, and then use these probabilities to decide whether it is beneficial to merge regions and reduce the overhead of extra merge and split blocks. For example, when the profile feedback indicates that predicates {A OR C} and {A} have the same probability, then it may be more beneficial to merge regions and remove extra merge and split blocks between them. On the other hand, if predicate {A OR C} has substantially higher probability than {A}, it may be more beneficial to keep these two regions separate, rather than merging them.

The proposed modification techniques can reduce the number of inserted samplers (e.g., merge blocks or split blocks) by selectively giving up some predication opportunities. For example, the modification technique can estimate how a predicated netlist will impact performance and power consumption, providing a basis for choosing to refrain from inserting split and merge blocks for predicated regions with high implementation overhead. In some embodiments, the modification technique may reduce overhead by moving one or more split function blocks to a location in the asynchronous netlist that reduces routings used by control signals, as discussed below with respect to FIG. 7, reduces changes to the netlist, or better match underlying asynchronous architecture.

Figure 7:
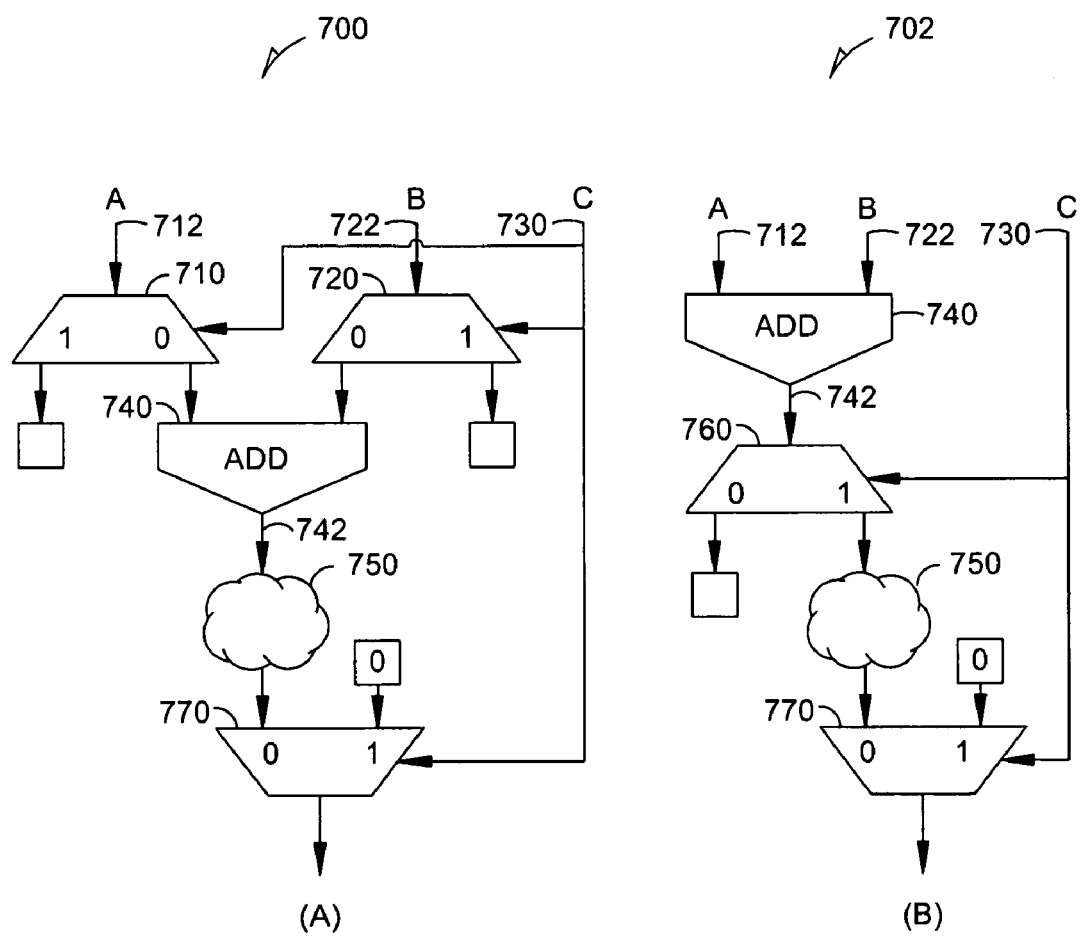
FIG. 7 is a diagram illustrating moving split blocks from the fan-in to the fan-out of an asynchronous dataflow computation block, according to various embodiments of the invention.

FIG. 7 is a diagram illustrating moving split blocks 710 and 720 from the fan-in to the fan-out of an asynchronous dataflow computation block, according to various embodiments of the invention. A dataflow graph 700 shows an example of implementing conditional execution. The predicated region includes ADD 740 and a computation sub-graph 750. The inputs A and B for ADD 740 are down-sampled by two split blocks 710 and 720. The output from the computation sub-graph 750 is upsampled by a merge block 770. Since both inputs 712 and 722 and the output 742 of ADD 740 have the same predicate, we can down-sample the output 742 of ADD 740 instead of the inputs 712 and 722.

This transformation may give up the opportunity to execute ADD 740 conditionally, but it may also reduce the number of splits and preserve conditional execution of computation sub-graph 750 after ADD 740.

A dataflow graph 702 shows the result of moving splits from the fan-in to the fan-out of ADD 740. In this example, the transformation may reduce the total number of splits from two to one. More sophisticated versions of this modification can move splits to one or more locations that will reduce the routing used for the control signals.

We can also utilize profile feedback to automatically calculate how often a predicated region will be turned off during operation. When profile feedback shows that results of the predicated computations are used most of the time, it is possible that better power conservations results will accrue if such computations are not predicated. For example, profile feedback could indicate that in a realistic environment token values produced by the predicated region in the dataflow graph 700 may not be discarded 90% of the time. In this case, extra split blocks, merge blocks, and routing resources for conditional execution might operate to unnecessarily burn power 90% of the time. As a result, non-selectively optimizing conditional execution may result in burning more power than the original unmodified design. Thus, the proposed predication algorithm can take this type of profile information into account and choose not to implement conditional execution for predicated regions that are rarely be turned off, perhaps based on the simulation of ultimate power consumption results.

Predication overhead can also be reduced by introducing new hardware resources. For example, a certain type of split block may be introduced that uses one control signal to manage the merging of multiple inputs to multiple outputs. This may in turn reduce power overhead of predicated execution. Many other modifications may be possible, including designing special computation blocks with conditional inputs, conditional outputs, or both. However, the mechanism for making the tokens conditional remains the same.

Figure 8:
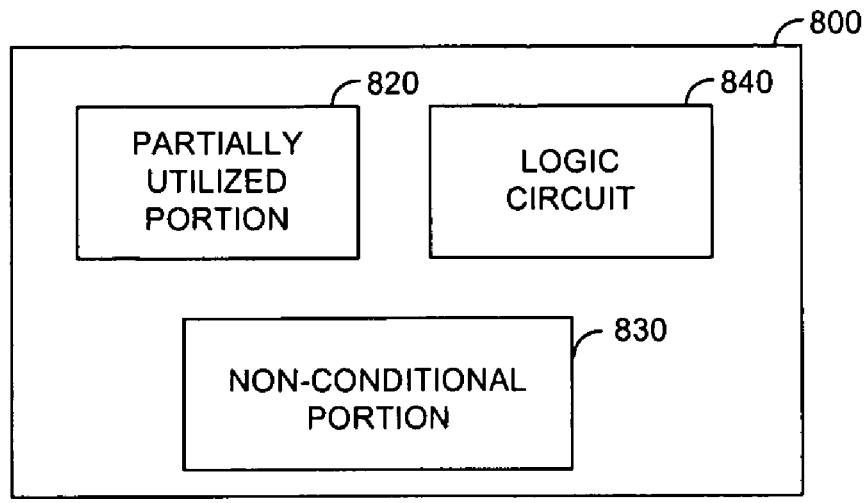
FIG. 8 is a block diagram illustrating an asynchronous integrated circuit implementation based on a predicated asynchronous netlist, according to various embodiments of the invention.

FIG. 8 is a block diagram illustrating an asynchronous integrated circuit 800 implementation based on a predicated asynchronous netlist, according to various embodiments of the invention. The asynchronous integrated circuit 800 may comprise a partially utilized portion 820 and a logic circuit 840. The partially utilized portion 820 may correspond to partially utilized portions of the asynchronous netlist 104 of FIG. 1 identified by the processor 910 of FIG. 9. The non-conditional portion 830 of the asynchronous circuit 800 may correspond to other portions of the asynchronous netlist 104 of FIG. 1 not including the partially utilized portion 820 and the logic circuit 840. The partially utilized portion 820 may generate results that can be discarded during the operation of the asynchronous integrated circuit 800.

The asynchronous netlist 104 (see FIG. 1) may be modified to control the partially utilized portions of the netlist 104. The modification may be related to the addition of a netlist corresponding to the logic circuit 840 that controls the partially utilized portion 820. The logic circuit 840 may control the partially utilized portion 820 by dynamically turning off blocks that generate unused results. The logic circuit 840 may perform conditional executions of logic blocks that can dynamically disable the blocks, which produce computational results that are not used by other segments of the integrated circuit 800. In some embodiments, the additional netlist portion corresponding to the logic circuit 840 may comprise predicated dataflow graphs as described above, produced by modules of an example system 900 shown in FIG. 9.

Figure 9:
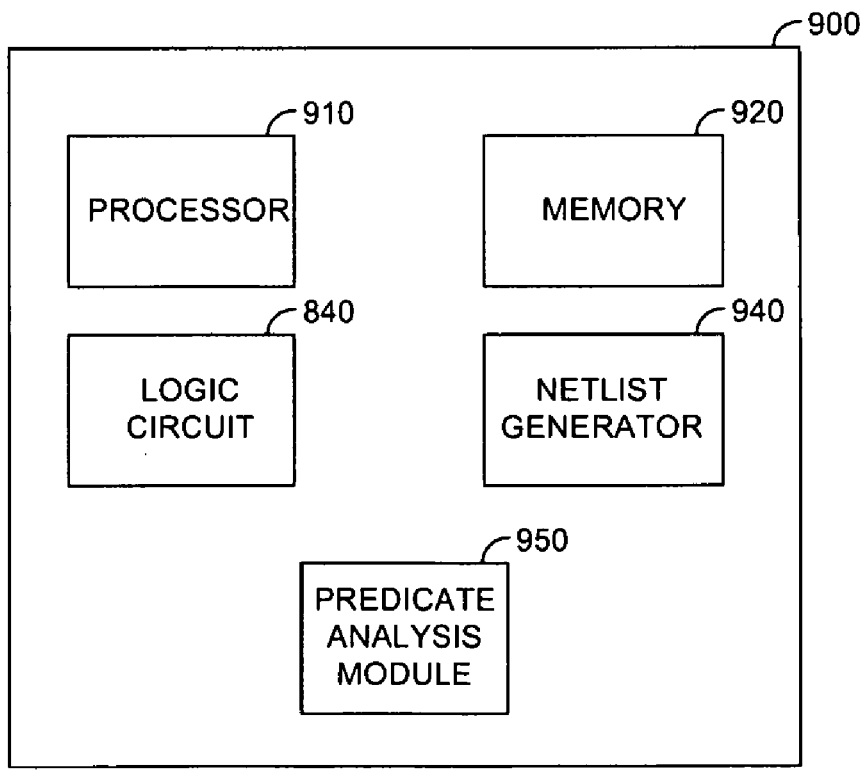
FIG. 9 is a block diagram illustrating a system for converting a non-predicated asynchronous netlist of an asynchronous circuit to a predicated asynchronous netlist, according to various embodiments of the invention.

FIG. 9 is a block diagram illustrating a system 900 for converting a non-predicated asynchronous netlist of an asynchronous circuit (e.g., asynchronous integrated circuit 800 of FIG. 8) to a predicated asynchronous netlist, according to various embodiments of the invention. The system 900 may include one or more of any one of the following elements: a processor 910, a memory 920, the logic circuit 840, a netlist generator 940, and a predicate analysis module 950. The processor 910 may operate to identify one or more portions of the asynchronous netlist 104 (see FIG. 1) that corresponds to a number of partially utilized portions of the asynchronous integrated circuit 800 of FIG. 8.

In example embodiments, the processor 910 may operate to modify the asynchronous netlist 104. The modification may be related to the logic circuit 840. The logic circuit 840 may control the partially utilized portion of the asynchronous integrated circuit 800. The processor 910 may determine that the asynchronous netlist 104 (see FIG. 1) is associated with a portion of an asynchronous integrated circuit 800 that generates a result that may be unutilized under identifiable conditions. The identifiable conditions may be identifiable based on dynamic profile information. The dynamic profile information may contain real-time information regarding utilization of results produced by predicated portions of the predicated asynchronous netlist 106 of FIG. 1. The processor 910 may store the dynamic profile information in the memory 920.

The logic circuit 840 may control the partially utilized portion 820 of the asynchronous integrated circuit 800, based on the identified conditions, for example, a condition under which certain logic blocks may produce unused results. The netlist generator 940 (e.g., EDIF reader tool 101 of FIG. 1) may generate the asynchronous netlist 104 (see FIG. 1) corresponding to the asynchronous circuit and an additional netlist portion corresponding to the logic circuit 840. The predicate analysis module 950 may predicate a dataflow graph corresponding to the asynchronous circuit (e.g., dataflow computation graph 400 of FIG. 4). The predicate analysis module 950 may operate to identify one or more functional blocks or edges of the dataflow graph that correspond to the partially utilized portion 820 of the asynchronous integrated circuit 800.

The predicate analysis module 950 may operate to mark the one or more functional blocks or edges with a predicate mark, such as {C} and {–C} marks shown in FIG. 4, to indicate a controlling signal and a condition under which the controlling signal may exert control. For example, the mark {C} may indicate that the marked edge is controlled by the value of the control signal C, for example, in the sense that it may be turned off when C is true. The predicate analysis module 950 may also operate to propagate a predication of a predicated output edge (e.g., output edge 415 of FIG. 4) of a functional block (e.g., ADD 410 of FIG. 4) to one or more input edges of the functional block (e.g., input edges 411 and 412 of FIG. 4).

In some example embodiments, the logic circuit 840 may correspond to an additional netlist portion associated with a functional block that includes one or more split or merge functional blocks. The logic circuit 840 may also correspond to an additional netlist portion associated with a predicated asynchronous netlist 106 (see FIG. 1) that includes one or more computational blocks that may have a number of conditional inputs or outputs (see, for example, FIG. 5).

Figure 10:
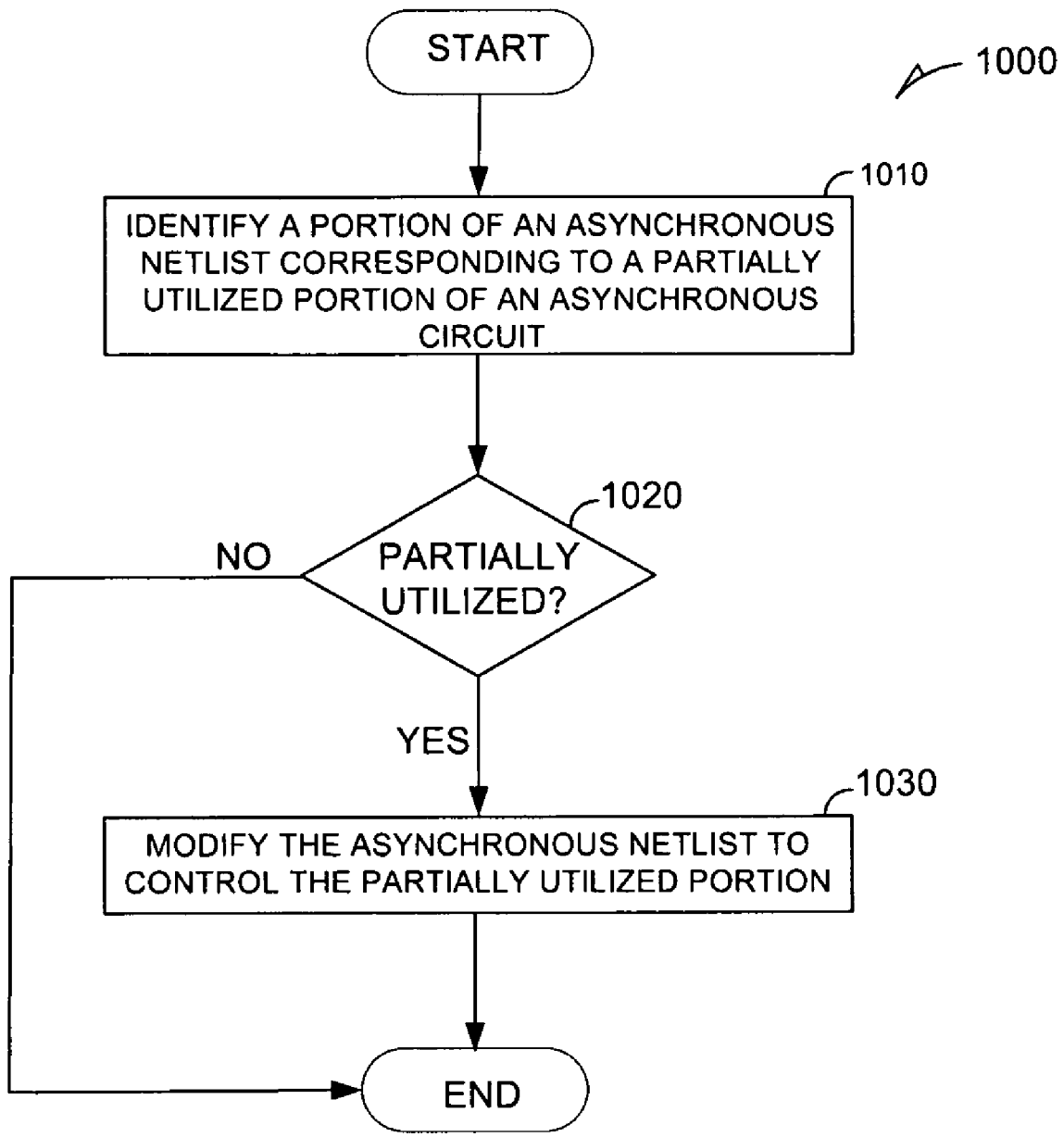
FIG. 10 is a flow diagram illustrating a method of converting a non-predicated asynchronous netlist to a predicated asynchronous netlist, according to various embodiments of the invention.

FIG. 10 is a flow diagram illustrating a method 1000 of converting a non-predicated asynchronous netlist to a predicated asynchronous netlist, according to various embodiments of the invention. The method 1000 may start at operation 1010, where the processor 910 of FIG. 9 may operate to identify one or more portions of an asynchronous netlist (e.g., asynchronous net list 104 of FIG. 1) that corresponds to some partially utilized portions of the logic circuit 840 of FIG. 8. The processor 910 may operate to determine that the asynchronous netlist 104 is associated with a portion (e.g., some computational blocks) of an asynchronous integrated circuit 800 that generates a result that is unutilized under conditions that may be identifiable based on the dynamic profile information, as discussed above with respect to FIG. 9.

At decision block 1020, when it is determined that the asynchronous netlist 104 (see FIG. 1) is not associated with some computational blocks that generate unused results, the method 1000 may come to an end. Otherwise, at operation 1030, the asynchronous netlist 104 (see FIG. 1) is modified to incorporate additional netlist portion corresponding to a control logic such as the control circuit 840 of FIG. 8, to control the partially utilized portion 820 of the asynchronous integrated circuit 800, as described above with respect to FIGS. 8 and 9.

Figure 11:
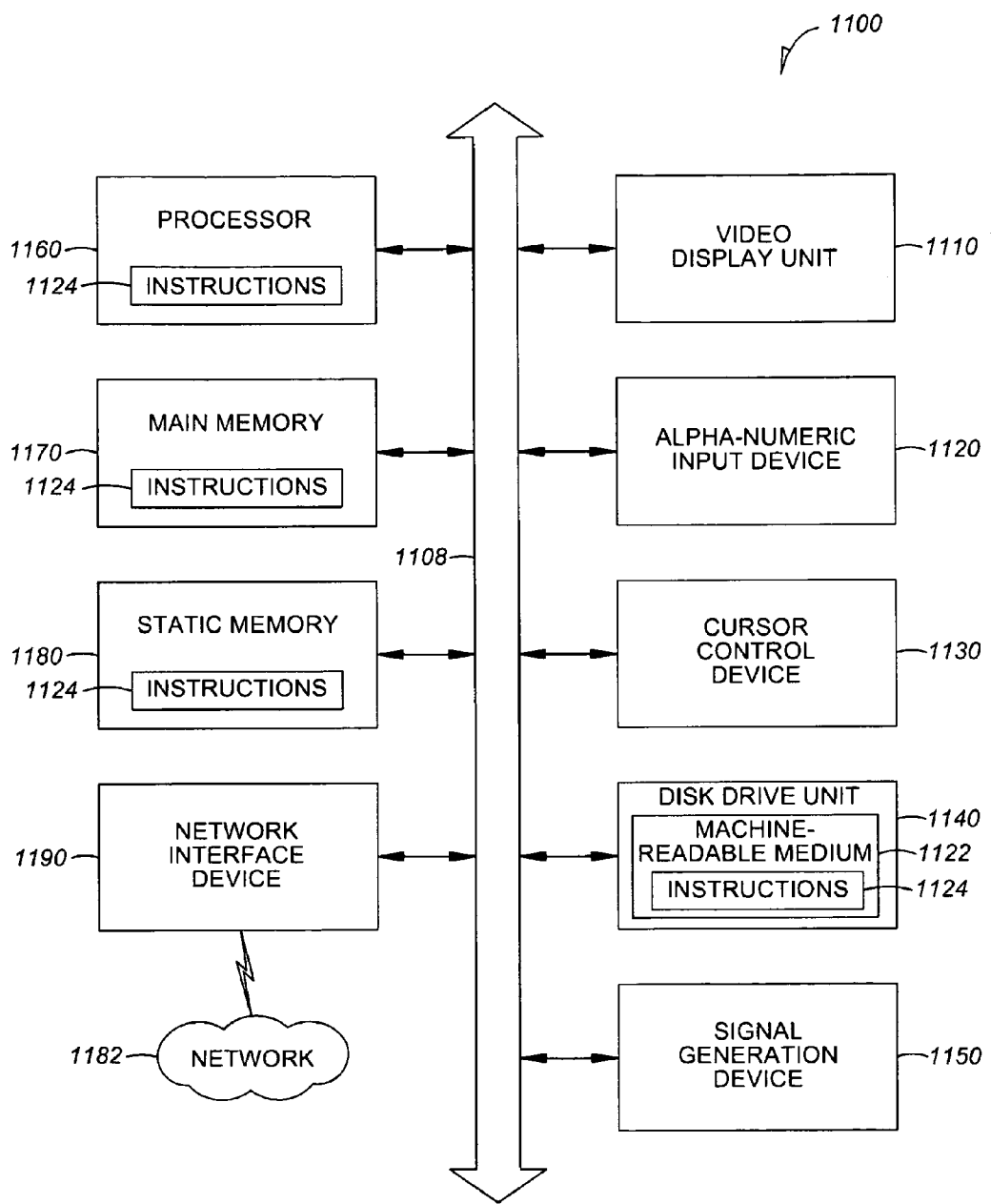
FIG. 11 shows a diagram illustrating a representation of a machine, according to various embodiments of the invention.

FIG. 11 shows a diagram illustrating a representation of a machine 1100, according to various embodiments of the present invention. The machine 1100 comprises a set of instructions that can be executed to cause the machine 1100 to perform any one or more of the methodologies discussed herein. In alternative embodiments, the machine 1100 may operate as a standalone device or may be connected (e.g., networked) to other systems. In a networked deployment, the machine 1100 may operate in the capacity of a server or a client system in a server-client network environment or as a peer system in a peer-to-peer (or distributed) network environment. Machine 1100 may be realized as a specific machine in the form of a computer having a display and/or multiple processors, as well as a network interface. The machine 1100 may operate to implement any one or more of the elements illustrated in FIG. 1.

The machine 1100 may comprise a server computer, a client computer, a personal computer (PC), a tablet PC, or any system capable of executing a set of instructions (sequential or otherwise) that specify actions to be taken by that system. Further, while only a single machine is illustrated, the term "machine" shall also be taken to include any collection of systems that individually or jointly execute a set (or multiple sets) of instructions to perform any one or more of the methodologies discussed herein.

The example machine 1100 may include the processor 1160 (e.g., a central processing unit (CPU), a graphics processing unit (GPU) or both), a main memory 1170 and a static memory 1180, all of which communicate with each other via a bus 1108. The machine 1100 may further include a video display unit 1110 (e.g., a liquid crystal display (LCD) or cathode ray tube (CRT)). The machine 1100 also may include an alphanumeric input device 1120 (e.g., a keyboard), a cursor control device 1130 (e.g., a mouse), a disk drive unit 1140, a signal generation device 1150 (e.g., a speaker), and a network interface device 1190. The machine 1100 may include one or more of any of these elements.

The disk drive unit 1140 may include a machine-readable medium 1122 on which is stored one or more sets of instructions (e.g., software) 1124 embodying any one or more of the methodologies or functions described herein. The instructions 1124 may also reside, completely or at least partially, within the main memory 1170 and/or within the processor 1160 during execution thereof by the machine 1100, with the main memory 1170 and the processor 1160 also constituting machine-readable media. The instructions 1124 may further be transmitted or received over a network 1182 via the network interface device 1190.

While the machine-readable medium 1122 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium capable of storing, encoding, or carrying a set of instructions for execution by the machine and that cause the machine to perform any one or more of the methodologies of the present technology. The term "machine-readable medium" shall accordingly be taken to include, but not be limited to tangible media, including solid-state memories and optical and magnetic media.

Various embodiments for converting of a non-predicated asynchronous netlist to a predicated asynchronous netlist have been described. Implementing such circuits may result in reduced power consumption, reduced die area, and increased processing speed. The described embodiments may reduce power consumption of asynchronous circuits by providing an automated, non-interactive algorithm to convert non-predicated asynchronous circuit designs to and from predicated asynchronous circuit designs. This technology allows reducing power consumption of asynchronous designs without changing electronic design automation (EDA) tools that provide optimal computation mapping of a design onto asynchronous hardware resources. The technology described herein also facilitates taking advantage of dynamic profile information to provide power savings for a given design. The proposed methods may also operate to modify designs without interfering with the work of the circuit designers.

Although the present embodiments have been described, it will be evident, after reading this disclosure, that various modifications and changes may be made to these embodiments. Accordingly, the specification and drawings are to be regarded in an illustrative rather than a restrictive sense.

The abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

The invention claimed is:

1. A method comprising:
identifying, by a processor, at least one portion of an asynchronous netlist corresponding to a partially utilized portion of an asynchronous circuit, the identifying including determining that the partially utilized portion is configured to generate a result to be discarded prior to being utilized by another portion of the asynchronous circuit under identifiable conditions; and
modifying, by the processor, the asynchronous netlist to generate an additional netlist portion corresponding to a logic circuit that operates to control the partially utilized portion.

2. The method of claim 1, further comprising:
identifying, by the processor, the identifiable conditions, the identifiable conditions including profile conditions identifiable based on dynamic profile information.

3. The method of claim 2, further comprising:
controlling the partially utilized portion of the asynchronous circuit based on the profile conditions.

4. The method of claim 1, further comprising:
predicating a dataflow graph corresponding to the asynchronous circuit.

5. The method of claim 4, wherein the predicating of the data-flow graph comprises:
identifying at least one functional block or edge of the data-flow graph that corresponds to the partially utilized portion of the asynchronous circuit; and
marking the at least one functional block or edge with a predicate mark, the predicate mark indicating a controlling signal.

6. The method of claim 5, wherein the marking of the at least one functional block or edge further comprises:
indicating by the predicate mark a condition under which the controlling signal controls the at least one functional block or edge.

7. The method of claim 5, wherein the controlling signal causes a signal associated with the at least one functional block or edge to be discarded.

8. The method of claim 5, wherein the marking of the at least one functional block or edge further comprises:
propagating a predication of a predicated output edge of a functional block to at least one input edge of the functional block.

9. The method of claim 1, wherein the modifying of the asynchronous netlist comprises:
generating the additional netlist portion corresponding to a merged region resulting from merging of at least two predicated regions of the asynchronous circuit.

10. The method of claim 1, wherein the modifying of the asynchronous netlist comprises:

moving at least one split function block from a predicated region of the asynchronous netlist to a location in the asynchronous netlist that reduces routings used by control signals.

11. The method of claim 1, wherein the logic circuit corresponds to a predicated asynchronous netlist that includes at least one computational block having at least one of a plurality of conditional inputs or a plurality of conditional outputs.

12. A system comprising:
memory to store netlist information; and
a processors communicatively coupled to the memory, the processor configured to:
identify at least one portion of an asynchronous netlist that corresponds to a partially utilized portion of an asynchronous circuit, the identifying including determining that the partially utilized portion is configured to generate a result to be discarded prior to being utilized by another portion of the asynchronous circuit under identifiable conditions; and
modify the asynchronous netlist associated with the netlist information to generate an additional netlist portion corresponding to a logic circuit that operates to control the partially utilized portion.

13. The system of claim 12, wherein the determining is based on dynamic profile information.

14. The system of claim 12, wherein the processor is further to identify the identifiable conditions including conditions identifiable using dynamic profile information.

15. The system of claim 12, further comprising:
a netlist generator to generate a netlist corresponding to the asynchronous circuit and an additional netlist portion corresponding to the logic circuit.

16. The system of claim 12, further comprising:
a predicate analysis module to predicate a dataflow graph corresponding to the asynchronous circuit, wherein the predicate analysis module is to identify at least one functional block or edge of the data-flow graph that corresponds to the partially utilized portion of the asynchronous circuit, and to mark the at least one functional block or edge with a predicate mark, the predicate mark indicating a controlling signal.

17. The system of claim 16, wherein the predicate analysis module is further to indicate by the predicate mark a condition under which the controlling signal controls the at least one functional block or edge.

18. The system of claim 16, wherein the predicate analysis module is further to propagate a predication of a predicated output edge of a functional block to at least one input edge of the functional block.

19. The system of claim 12, wherein the modifying comprises:
marking the at least one portion of the asynchronous netlist with a predicate mark, the predicate mark indicating a controlling signal to control the partially utilized portion.

20. The system of claim 12, further comprising:
a display unit to display the additional netlist portion.

21. A non-transitory machine-readable storage medium storing instructions, which when executed by one or more processors, cause the one or more processors to perform operations comprising:
identifying at least one portion of an asynchronous netlist that corresponds to a partially utilized portion of an asynchronous circuit, the identifying including determining that the partially utilized portion is configured to generate a result to be discarded prior to being utilized by another portion of the asynchronous circuit under identifiable conditions; and
modifying the asynchronous netlist to generate an additional netlist portion corresponding to a logic circuit that operates to control the partially utilized portion.

22. An asynchronous integrated circuit comprising:
a partially utilized portion, including at least one portion that generates at least one output, the at least one output to be discarded prior to being utilized by another portion of the asynchronous integrated circuit under identifiable conditions; and
a logic circuit to control the partially utilized portion, including to turn off the partially utilized portion.

23. The asynchronous integrated circuit of claim 22, wherein the logic circuit corresponds to a functional block that includes at least one of a split or a merge functional block.

24. The asynchronous integrated circuit of claim 22, wherein the logic circuit corresponds to a split functional block inserted on an output edge of a predicated functional block lacking an input edge that has a first predicate mark similar to a second predicate mark associated with the output edge.

25. The asynchronous integrated circuit of claim 22, wherein the logic circuit corresponds to a merge functional block inserted on at least one input edge of a predicated functional block lacking an output edge that has a first predicate mark similar to a second predicate mark associated with the at least one input edge.

26. The asynchronous integrated circuit of claim 22, wherein the logic circuit is configured to control the partially utilized portion of the asynchronous circuit based on the conditions identifiable using dynamic profile information.

27. The asynchronous integrated circuit of claim 22, wherein the logic circuit corresponds to an additional netlist portion associated with a merged region resulting from merging of at least two predicated regions of the asynchronous netlist.

28. The asynchronous integrated circuit of claim 22, wherein the logic circuit corresponds to an additional netlist portion associated with a predicated region of the asynchronous netlist that includes at least one split function block moved to a location in the asynchronous netlist.

29. The asynchronous integrated circuit of claim 22, wherein the logic circuit corresponds to an additional netlist portion associated with a predicated asynchronous netlist that includes at least one computational block that has at least one of a plurality of conditional inputs or a plurality of conditional outputs.

* * * * *

UNITED STATES PATENT AND TRADEMARK OFFICE
CERTIFICATE OF CORRECTION

PATENT NO. : 8,191,019 B2
APPLICATION NO. : 12/505296
DATED : May 29, 2012
INVENTOR(S) : Manohar et al.

It is certified that error appears in the above-identified patent and that said Letters Patent is hereby corrected as shown below:

In column 1, line 16, after "operations", insert --.--, therefor

In column 2, line 7, delete "than", and insert --that--, therefor

In column 2, line 34, delete "a", and insert --as--, therefor

In column 3, line 49, after "term", delete "the", therefor

In column 4, line 50, after FIG. 4, insert --.--, therefor

In column 13, line 11, in Claim 12, delete "processors", and insert --processor--, therefor In column 13, line 13, in Claim 12, delete "identify", and insert --identifying--, therefor Signed and Sealed this
Eleventh Day of September, 2012

David J. Kappos
*Director of the United States Patent and Trademark Office*